United States Patent
Chang et al.

(10) Patent No.: US 7,798,771 B2
(45) Date of Patent: Sep. 21, 2010

(54) HEAT DISSIPATING DEVICE

(75) Inventors: Shun-Chen Chang, Taoyuan Hsien (TW); Chia-Ming Hsu, Taoyuan Hsien (TW); Tsung-Yu Lei, Taoyuan Hsien (TW); Chin-Sheng Liu, Taoyuan Hsien (TW); Peng-Chu Tao, Taoyuan Hsien (TW); Chia-Ching Lin, Taoyuan Hsien (TW); Shih-Wei Huang, Taoyuan Hsien (TW); Ching-Chuang Mai, Taoyuan Hsien (TW); Wen-Shi Huang, Taoyuan Hsien (TW); Hsiou-Chen Chang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 747 days.

(21) Appl. No.: 11/645,654

(22) Filed: Dec. 27, 2006

(65) Prior Publication Data

US 2007/0286721 A1    Dec. 13, 2007

(30) Foreign Application Priority Data

Jun. 8, 2006    (TW) .............................. 95120366 A

(51) Int. Cl.
*F01D 1/02*    (2006.01)

(52) U.S. Cl. .................................. 415/182.1; 415/199.1
(58) Field of Classification Search .............. 415/182.1, 415/184, 185, 187, 190, 193, 194, 198.1, 415/199.1, 199.4, 199.5
See application file for complete search history.

(56) References Cited

U.S. PATENT DOCUMENTS

| | | | | | |
|---|---|---|---|---|---|
| 1,997,506 | A | * | 4/1935 | Adamcikas et al. | 415/192 |
| 2,037,395 | A | * | 4/1936 | Seelig | 415/160 |
| 2,121,073 | A | * | 6/1938 | De Bothezat | 417/247 |
| 2,298,576 | A | * | 10/1942 | McElroy et al. | 415/191 |
| 3,830,587 | A | * | 8/1974 | Shipes et al. | 415/130 |
| 2004/0141841 | A1 | * | 7/2004 | Otsuka | 415/220 |
| 2007/0286720 | A1 | * | 12/2007 | Chang et al. | 415/198.1 |

* cited by examiner

*Primary Examiner*—Igor Kershteyn
(74) *Attorney, Agent, or Firm*—Birch, Stewart, Kolasch & Birch, LLP

(57) ABSTRACT

A heat dissipating device includes an outer frame, a first rotor, a base, a second rotor and a driving device. The first rotor comprises a shaft, a first hub and a plurality of first rotor blades disposed around the first hub. The base is disposed in the outer frame. The second rotor comprises a plurality of second rotor blades, coupled to the shaft of the first rotor and disposed next to the first rotor. The driving device is supported by the base for driving the first rotor and the second rotor.

23 Claims, 7 Drawing Sheets

HEAT DISSIPATING DEVICE

BACKGROUND OF THE INVENTION

1. Field of the Invention

The invention relates to a heat dissipating device, and more particularly to a heat dissipating fan using a single high-efficiency motor to drive a plurality of rotors.

2. Description of the Related Art

With rapid development of electrical industry, natural convection is gradually being replaced by fans to dissipate the generated heat from electronic devices. Motors supply power to the fans for generating a large volume of airflow to dissipate a lot of heat from electronic elements. The way of increasing the volume of airflow is to increase the rotational speed of the fan, but the rotational speed of the fan cannot be arbitrarily increased. When the impeller of the fan rotates at high speed, the blades of the impeller bear large pressure and the loads on the motor and bearings thereof also increase. Accordingly, the blades of the impeller are easily deformed or even broken, and life of the fan is also shortened.

Serial arrangement of the fans is an alternative method of solving the described problem. Serially arranged fans rotate at a low speed but achieve the equivalent efficiency to a single fan rotated at a high speed. In FIG. 1, three fans 1, 1' and 1" are serially arranged. The fan 1 is independently actuated by a motor 11, the fan 1' is independently actuated by a motor 11', and the fan 1" is independently actuated by a motor 11".

When the number of serially arranged fans increases, particularly in small electronic devices, the volume, cost and difficulties in deploying the fans and the corresponding motors also increase. Moreover, when the impeller is rotated at high speed, the blades bearing high pressure are easily deformed or even broken.

BRIEF SUMMARY OF THE INVENTION

The invention provides a single high-efficiency motor to drive a shaft connected to a plurality of rotors arranged in series. Thus, the total volume of a high-efficiency heat dissipating fan can be reduced.

The heat dissipating device of one embodiment comprises an outer frame, a first rotor, a base, a second rotor and a driving device. The first rotor comprises a shaft, a first hub and a plurality of first rotor blades disposed around the first hub. The base is disposed in the outer frame. The second rotor comprises a plurality of second rotor blades, coupled to the shaft of the first rotor and disposed next to the first rotor. The driving device supported by the base, used for driving the first rotor and the second rotor. The heat dissipating device further comprises a plurality of supporting ribs or static blades used for connecting the base to the outer frame. The outer frame comprises a plurality of static blades disposed between the first rotor and the second rotor to increase workability of the second rotor. The static blade comprises a vertical distal end.

The height ratio between the first and second rotor blades of the first and second rotors and the static blades of the outer frame is preferably ranged from 1/1.1 to 1/1.4. The number of first rotor blades of the first rotor is different from the number of second rotor blades of the second rotor. The shape of the static blades of the outer frame is similar to that of the first and second rotor blades of the first and second rotors, or the static blade of the outer frame comprises a wing-shaped structure.

The first rotor comprises a windward side and a leeward side, and the second rotor is preferably disposed at the windward side or the leeward side of the first rotor. The second rotor further comprises a second hub and the first hub of the first rotor comprises a first top surface, and the shaft passing through the first top surface of the first hub is connected to the second hub of the second rotor. The second rotor further comprises a second hub having a second top surface, and the end of the shaft of the first rotor passing through the second top surface of the second hub is connected to the second rotor. The shaft of the first rotor and the second rotor are connected by riveting, screwing, adhering or other equivalent methods.

The second rotor further comprises a second hub, and the second hub is preferably hollow. The driving device is disposed in the first hub of the first rotor. The rotational speed of the first rotor is the same as that of the second rotor.

The heat dissipating device further comprises a third rotor serially connected to the second rotor. The second rotor further comprises a second hub and the third rotor comprises a third hub, and the shaft of the first rotor comprises a first end passing through the first top surface of the first rotor to connect to the second hub of the second rotor and a second end passing through the base to connect to the third hub of the third rotor. The first rotor comprises a windward side and a leeward side, and the second rotor and the third rotor are disposed at the windward side or the leeward side, or the second rotor and the third rotor are oppositely disposed at the windward side and the leeward side, respectively.

The heat dissipating device further comprises a first airflow guiding shroud. The outer frame comprises a first side and a second side opposite the first side. The first airflow guiding shroud is disposed at the first side of the outer frame. The heat dissipating device further comprises a second airflow guiding shroud. The outer frame comprises a first side and a second side opposite to the first side, and the second airflow guiding shroud is disposed at the second side of the outer frame. The heat dissipating device further comprises a plurality of static blades disposed in the second airflow guiding shroud. The first airflow guiding shroud or the second airflow guiding shroud comprises an outwardly-slanting or trumpet-like periphery. The outer frame and the first and second airflow guiding shrouds are connected by by engaging, locking or other equivalent methods.

The first hub of the first rotor preferably comprises a first top surface and a plurality of first dissipating holes formed on the first top surface, and the second rotor preferably comprises a second hub having a second top surface and a plurality of second dissipating holes formed on the second top surface. The first dissipating hole comprises a first slanted side wall and the second dissipating hole comprises a second slanted side wall.

The first hub of the first rotor preferably comprises a cone, wide-brimmed rain hat or slanted surface. The first rotor blades of the first rotor and the second rotor blades of the second rotor are slantedly and uprisingly formed.

The heat dissipating device further comprises a seat and the outer frame comprising a plurality of extensions formed with holes, wherein the extensions are connected to the seat via the holes thereof.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides a single high-efficiency motor to drive a plurality of serially arranged rotors.

Figure 1:
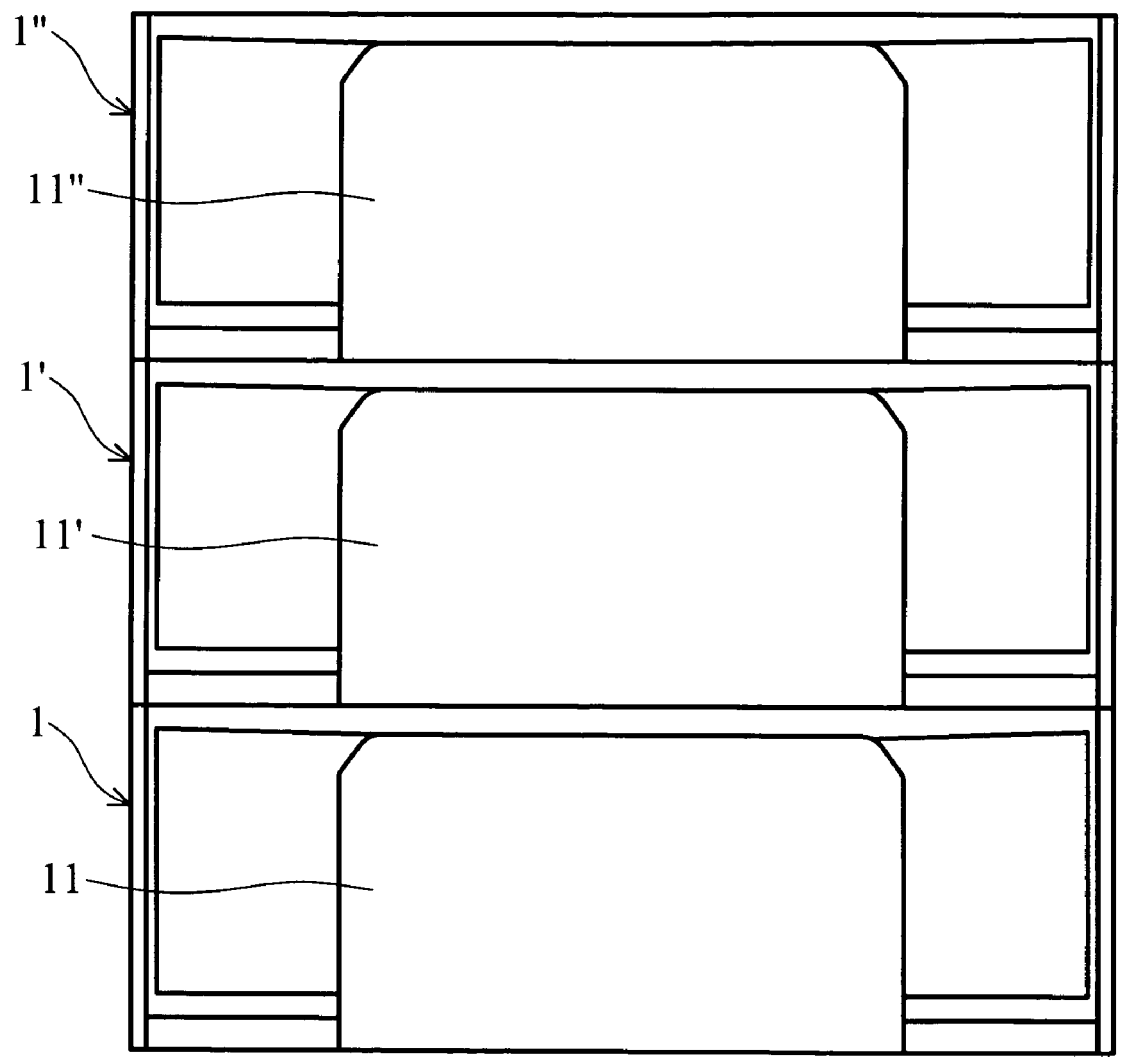
FIG. 1 is a schematic diagram of a conventional serially-arranged fan.
Figure 2:
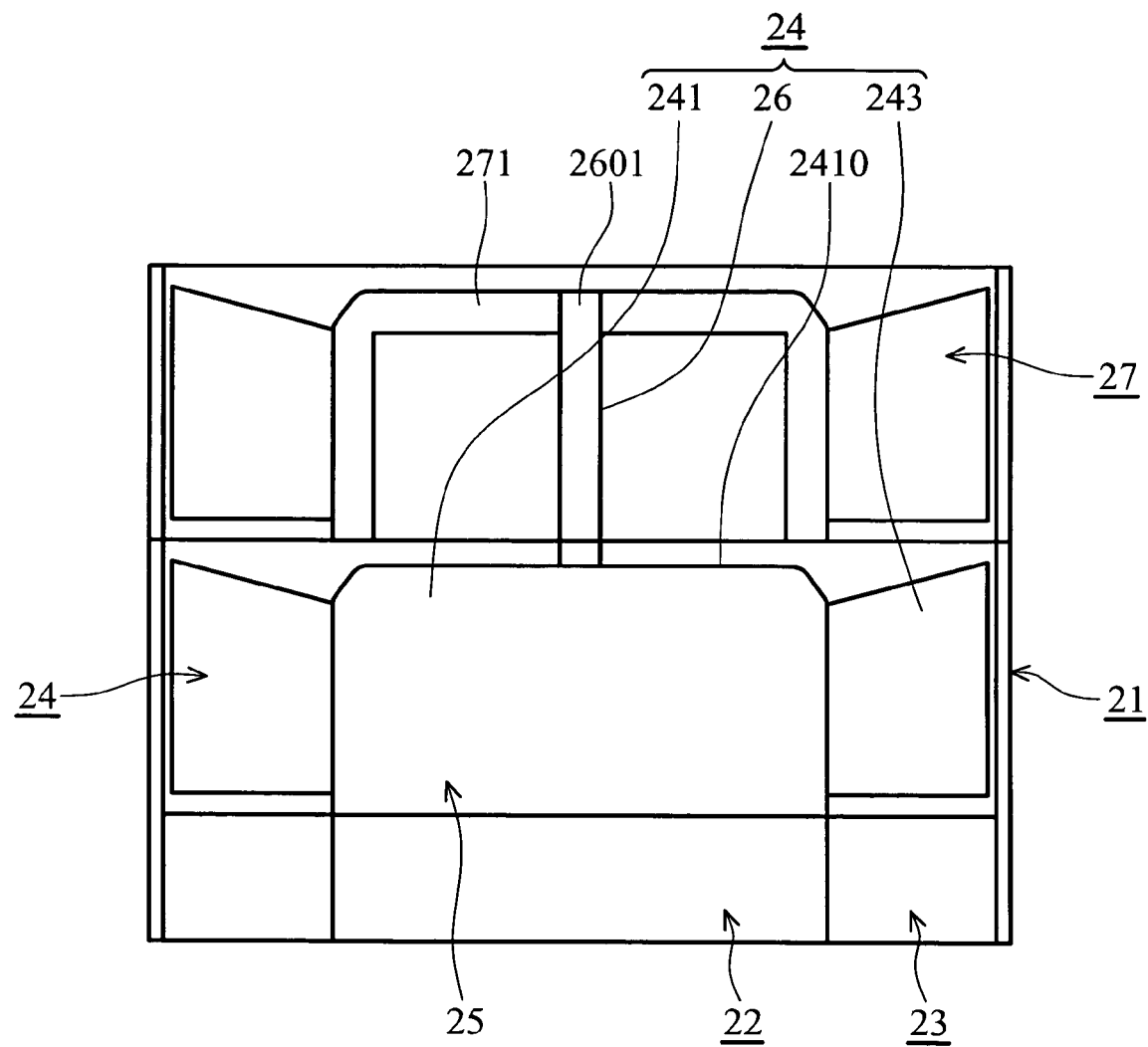
FIG. 2 is a schematic diagram of a heat dissipating device of a first embodiment of the invention.

In FIG. 2, a heat dissipating device of the first embodiment comprises an outer frame 21, a base 22, and a plurality of supporting ribs 23, a first rotor 24, a driving device 25 (for example, a motor) and a second rotor 27.

The base 22 is disposed in the outer frame 21. The supporting ribs 23 are disposed between the base 22 and the outer frame 21. The first rotor 24 comprises a shaft 26, a hub 241 and a plurality of first rotor blades 243 disposed around the hub 241. The second rotor 27 comprises a hollow hub 271 and a plurality of second rotor blades 273, and is coupled to the shaft 26 of the first rotor 24 and disposed next to the first rotor 24. The driving device 25, e.g. a motor, is supported by the base 22 and disposed within the hub 241 of the first rotor 24 for driving the first rotor 24 and the second rotor 27. The hub 241 of the first rotor 24 comprises a first top surface 2410, and the shaft 26 passing through the first top surface 2410 of the hub 241 is connected to the hub 271 of the second rotor 27. The end 2601 of the shaft 26 of the first rotor 24 and the second rotor 27 are connected by riveting, screwing, adhering or other equivalent ways. That is to say, the second rotor 27 is located at the windward side of the first rotor 24. Thus, the driving device 25 drives the shaft 26 to simultaneously rotate the first and second rotors 24 and 27, assuring the first and second rotors 24 and 27 rotated at the same speed.

Figure 3:
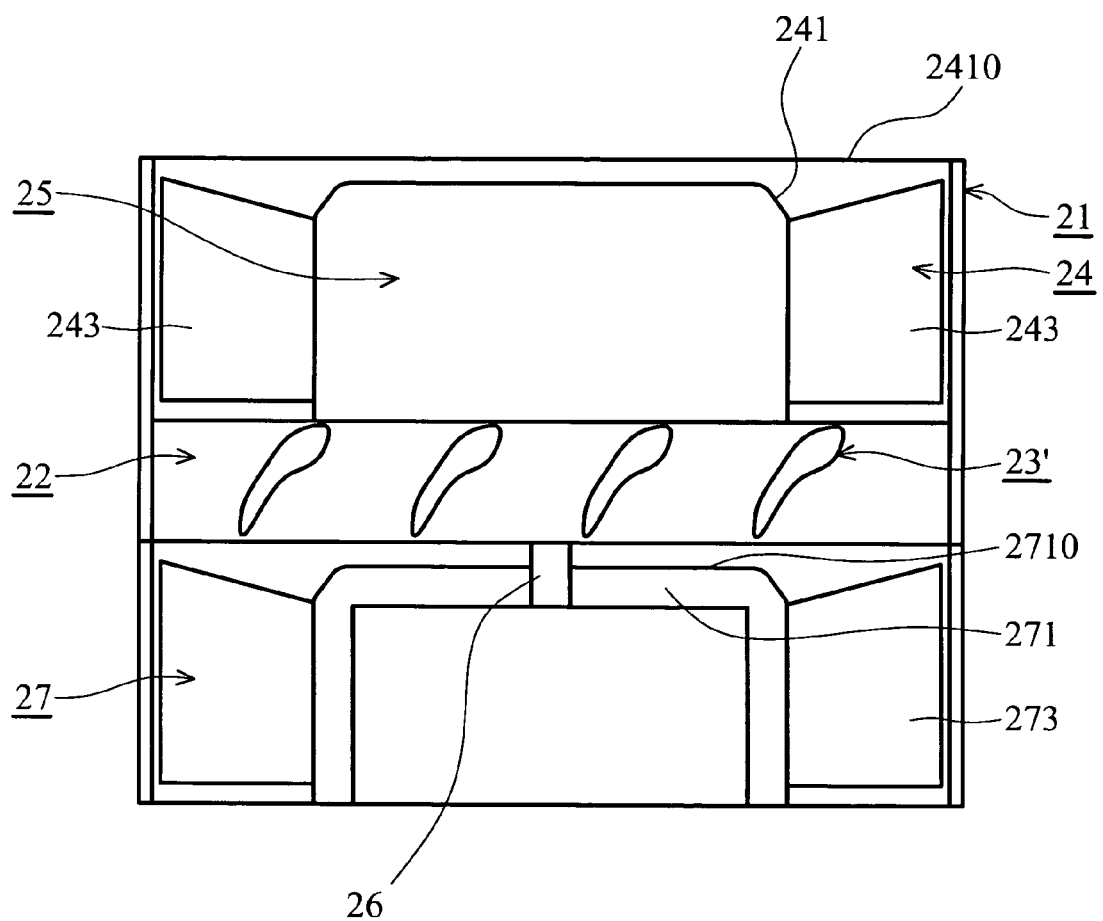
FIG. 3 is a schematic diagram of a heat dissipating device of a second embodiment of the invention.

FIG. 3 shows a heat dissipating device of the second embodiment. The heat dissipating device of this embodiment differs from that of the first embodiment in that the second rotor 27 is disposed at the rear end (leeward side) of the first rotor 24, and the supporting ribs 23 are replaced by static blades 23'. The hub 271 of the second rotor 27 has a second top surface 2710 and the shaft 26 of the first rotor 24 has an end passing through the second top surface 2710 of the hub 271. In this embodiment, the shape of the static blades 23' of the outer frame 21 is similar to that of the first and second rotor blades 243 and 273 of the first and second rotors 24 and 27, or the static blade 23' has a wing-shaped structure for increasing airflow pressure.

Figure 4:
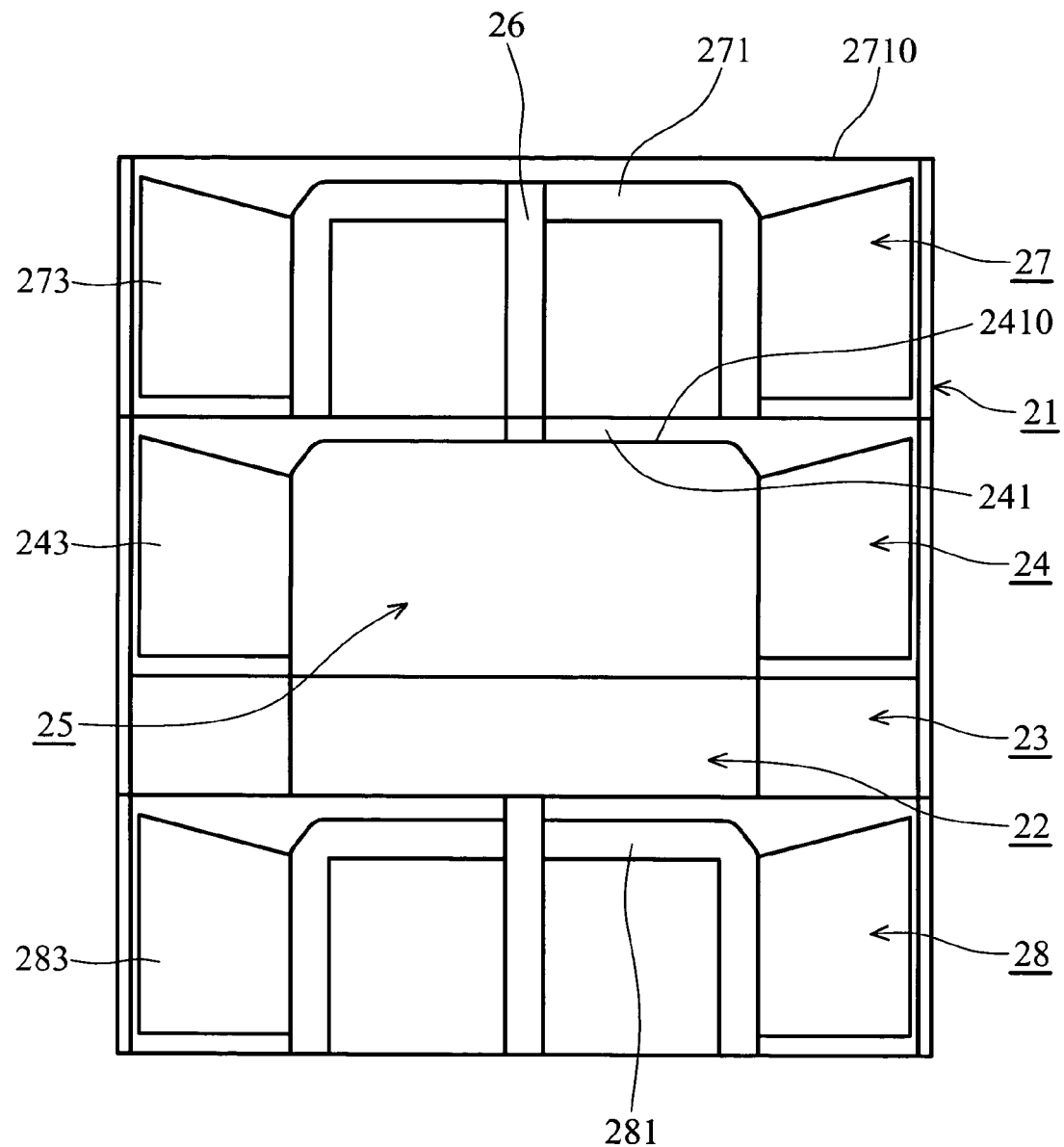
FIG. 4 is a schematic diagram of a heat dissipating device of a third embodiment of the invention.

Please refer to FIG. 4 showing a heat dissipating device of the third embodiment. The heat dissipating device differs from the heat dissipating device F1 of the first embodiment in that the third rotor 28 is further provided and connected to the second rotor 27 in series. The second rotor 27 and the third rotor 28 are disposed at the front end (windward side) and the rear end (leeward side) of the first rotor 24, respectively. One end of the shaft 26 of the first rotor 24 passing through the first top surface 2410 of the first rotor 24 connects to the hub 271 of the second rotor 27, and the other end of the shaft 26 of the first rotor 24 passing through the base 22 connects to the third hub 281 of the third rotor 28.

Figure 5:
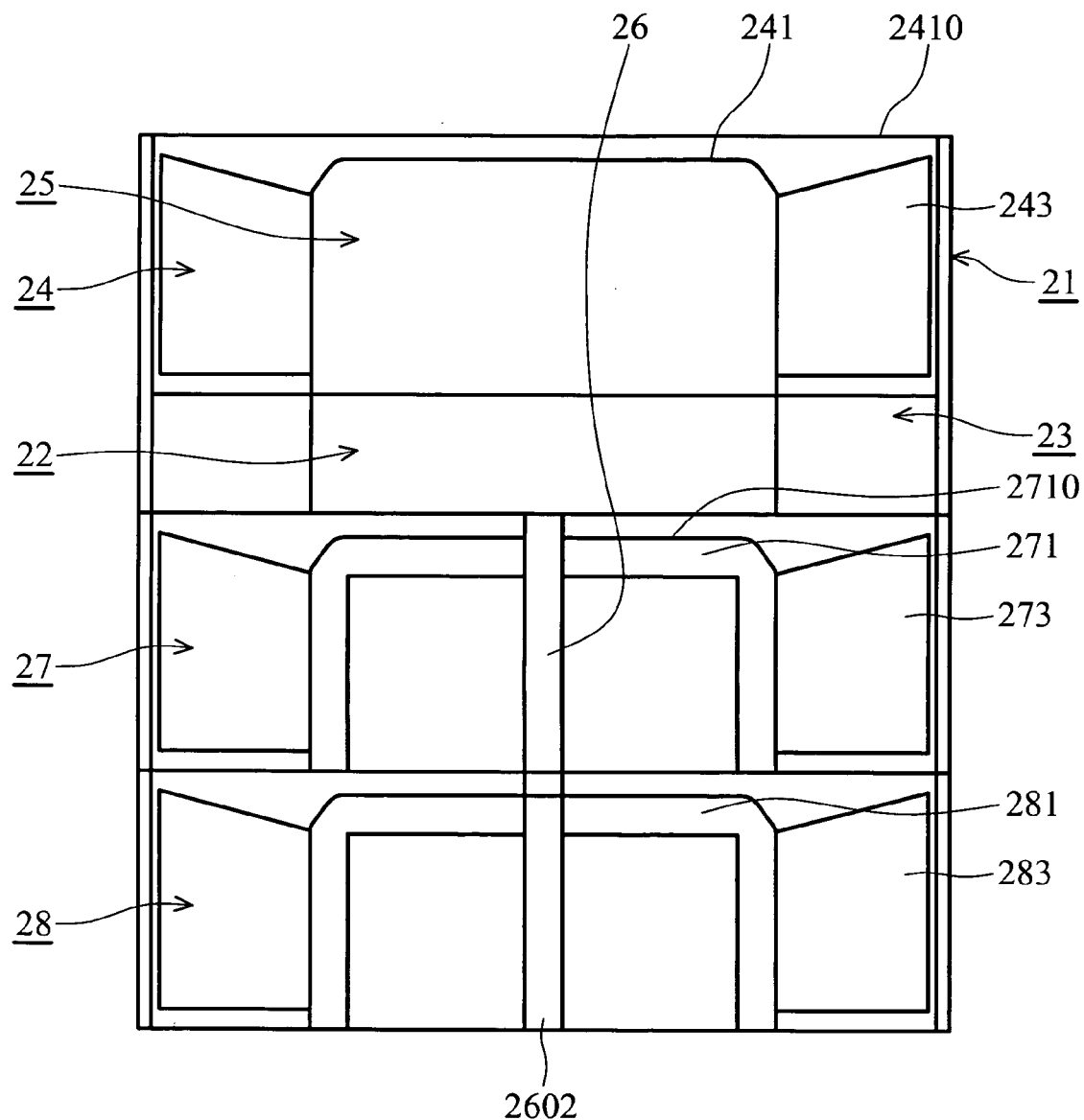
FIG. 5 is a schematic diagram of a heat dissipating device of a fourth embodiment of the invention.

FIG. 5 shows a heat dissipating device of the fourth embodiment. The heat dissipating device of this embodiment differs from that of the third embodiment in that the second rotor 27 and the third rotor 28 are disposed at the rear end (leeward side) of the first rotor 24. Alternatively, the second rotor 27 and the third rotor 28 can be disposed at the front end (windward side) of the first rotor 24.

Figure 6A:
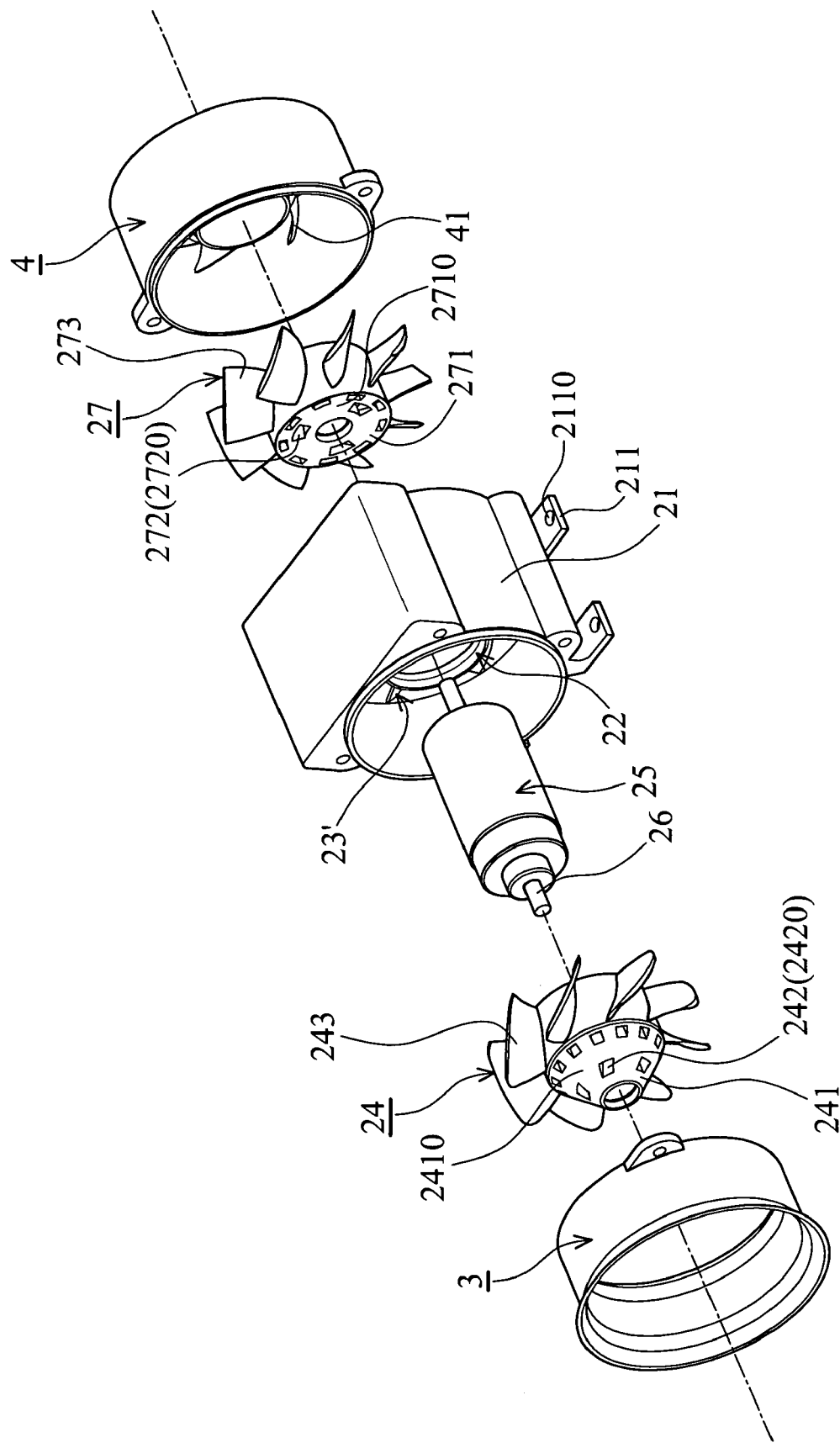
FIG. 6A is an exploded perspective view of a heat dissipating device of a fifth embodiment of the invention.
Figure 6B:
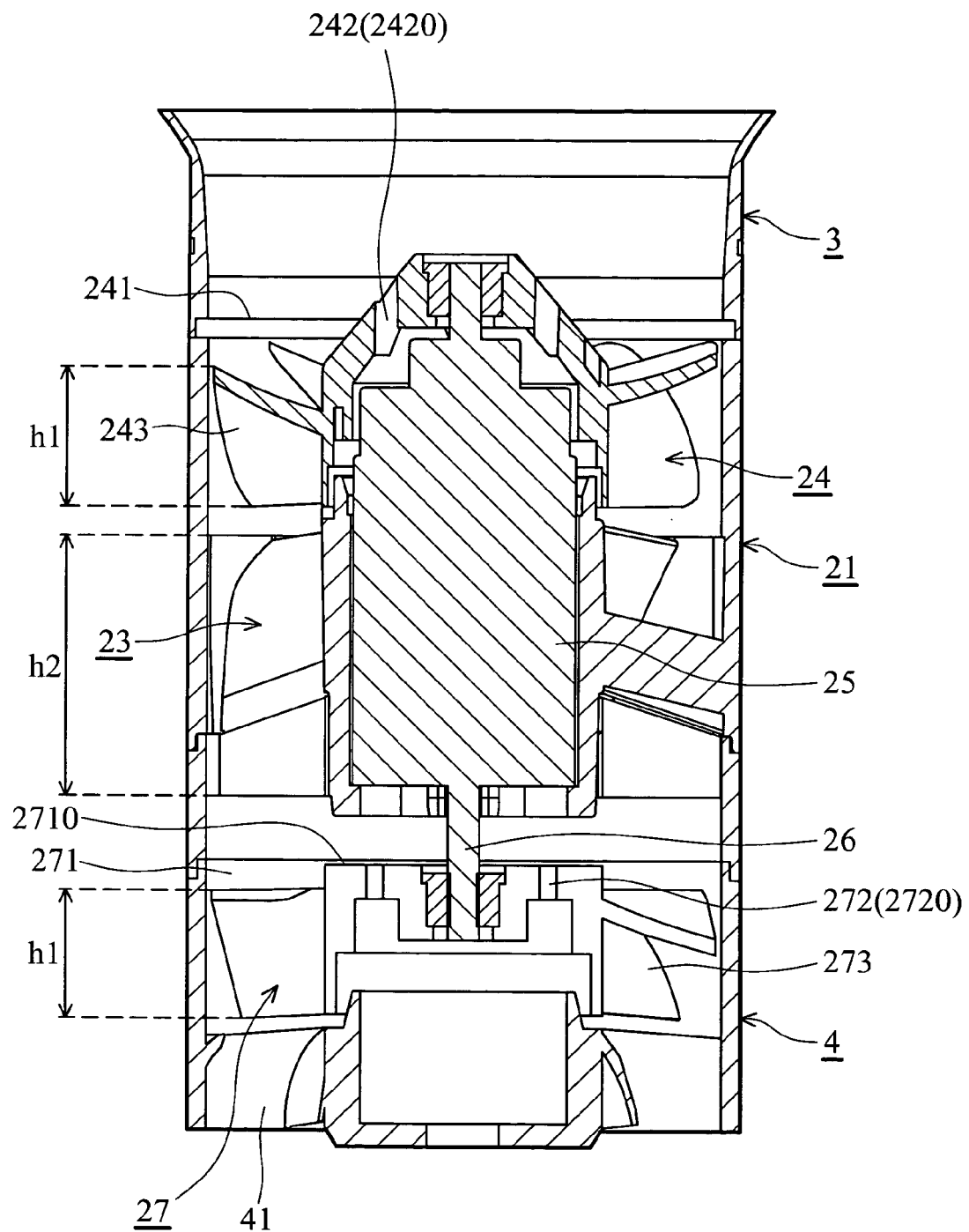
FIG. 6B is a sectional view of the assembled heat dissipating device of FIG. 6A after being assembled.

FIGS. 6A and 6B show a heat dissipating device of the fifth embodiment. The heat dissipating device comprises the outer frame 21 having a plurality of extensions 211 formed with holes 2110, the base 22, the static blades 23', the first rotor 24, the driving device 25, the second rotor 27, a first airflow guiding shroud 3, and a second airflow guiding shroud 4 having a plurality of static blades 41 disposed therein. The heat dissipating device differs from that of the second embodiment in that the former further comprises the first airflow guiding shroud 3 and the second airflow guiding shroud 4 respectively disposed at opposite sides of the outer frame 21. When the airflow passes through the second airflow guiding shroud 4, the airflow is further pressurized by the static blades 41 to increase total heat dissipation efficiency. Alternatively, the static blades can be disposed in the first airflow guiding shroud 3. The static blades 23' disposed between the first rotor 24 and the second rotor 27, particularly to the static blades 23' formed with vertical distal ends, increase workability of the second rotor 27. The first airflow guiding shroud 3 or the second airflow guiding shroud 4 comprises an outwardly-slanting or trumpet-like periphery. The outer frame 21 and the first and second airflow guiding shrouds 3 and 4 are connected by engaging, locking or other equivalent ways.

The hub 241 of the first rotor 24 comprises a first top surface 2410 and a plurality of first dissipating holes 242 formed on the first top surface 2410, and the hub 271 of the second rotor 27 comprises a second top surface 2710 and a plurality of second dissipating holes 272 formed on the second top surface 2710. The first dissipating hole 242 comprises a first slanted side wall 2420 and the second dissipating hole 272 comprises a second slanted side wall 2720. When the first and second rotors 24 and 27 are actuated by the driving device 25, the intake airflow passes through the first dissipating hole 242 of the first rotor 24 and the second dissipating holes 272 of the second rotor 27 to dissipate heat generated from the driving device 25. The hub 241 of the first-rotor 24 comprises a cone, tapered or slanted surface. The outer frame 21 can be assembled with the external system frame via the extensions 211 and holes 2110 thereof.

The ratio of the height h1 of the first or second rotor blades 243, 273 of the first or second rotors 24, 27 to the height h2 of the static blades 23' of the outer frame 21 ranges from 1/1.1 to 1/1.4. It should be noted that the first and second rotors 24 and 27 are rotated at the same speed, so the number of the first rotor blades 243 of the first rotor 24 is preferably different from that of the second rotor blades 273 of the second rotor 27 to avoid the frequency of the blades from concentrating on the same spot, thereby preventing increased noise. For example, the number of first rotor blades 243 of first rotor 24 is nine and the amount of the second rotor blades 273 of the second rotor 27 is eight or five when the number of static blades 23' of the outer frame 21 is seven. Alternatively, the number of first rotor blades 243 of the first rotor 24 is eight and the number of second rotor blades 273 of the second rotor 27 is nine or five.

The first rotor blades 243 of the first rotor 24 and the second rotor blades 273 of the second rotor 27 have an upwardly slated profile, respectively.

The heat dissipating device of the embodiment utilizes a single high-efficiency motor to drive a plurality of rotors; thus, total volume of a high-efficiency heat dissipating fan is reduced. The fans rotating at the low speed achieve the equivalent efficiency like that rotating at the high speed, thereby decreasing the surface stress of the blades and increasing the life of the motor. Furthermore, by using a single motor to drive a plurality of rotors, the number and cost of motors and cost can be reduced. In addition, due to that the rotors are directly rotated by the shaft, additional parts for the rotors, such as metallic cases or magnetic belts, can be eliminated so that material costs are reduced and the manufacturing cost is simplified.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat dissipating device, comprising:
   an outer frame;
   a first rotor comprising a shaft, a first hub and a plurality of first rotor blades disposed around the first hub;
   a base disposed in the outer frame;
   a second rotor comprising a plurality of second rotor blades and coupled to the shaft of the first rotor; and
   a driving device disposed in the first hub for driving the first rotor and the second rotor.

2. The heat dissipating device as claimed in claim 1 further comprising a plurality of supporting ribs or static blades for connecting the base to the outer frame.

3. The heat dissipating device as claimed in claim 1, wherein the outer frame comprises a plurality of static blades disposed between the first rotor and the second rotor to increase workability of the second rotor.

4. The heat dissipating device as claimed in claim 3, wherein the static blade comprises a vertical distal end.

5. The heat dissipating device as claimed in claim 3, wherein the height ratio of the first and second rotor blades of the first or second rotors to the static blades ranges from 1/1.1 to 1/1.4.

6. The heat dissipating device as claimed in claim 3, wherein the number of static blades is seven.

7. The heat dissipating device as claimed in claim 6, wherein the number of first rotor blades of the first rotor is nine, and the number of second rotor blades of the second rotor is eight or five; or the number of first rotor blades of the first rotor is eight, and the number of second rotor blades of the second rotor is nine or five.

8. The heat dissipating device as claimed in claim 3, wherein the shape of the static blades of the outer frame is similar to that of the first or second rotor blades, or the static blade of the outer frame comprises a wing-shaped structure.

9. The heat dissipating device as claimed in claim 1, wherein the second rotor is disposed at the windward side or the leeward side of the heat dissipating device.

10. The heat dissipating device as claimed in claim 1, wherein the second rotor further comprises a second hub, the first hub of the first rotor comprises a first top surface, and the shaft passing through the first top surface of the first hub is connected to the second hub of the second rotor by riveting, screwing, adhering or an equivalent way.

11. The heat dissipating device as claimed in claim 1, wherein the second rotor further comprises a second hub having a second top surface, and the end of the shaft of the first rotor passes through the second top surface of the second hub to be coupled with the second rotor by riveting, screwing, adhering or an equivalent way.

12. The heat dissipating device as claimed in claim 1 further comprising a third rotor coupled to the second rotor, the first rotor or both in series.

13. The heat dissipating device as claimed in claim 12, wherein the second rotor further comprises a second hub, the third rotor comprises a third hub, and the shaft of the first rotor comprises a first end passing through a first top surface of the first rotor to connect to the second hub of the second rotor and a second end passing through the base to connect to the third hub of the third rotor.

14. The heat dissipating device as claimed in claim 12, wherein the second rotor and the third rotor are disposed at the windward side or the leeward side of the heat dissipating device, or the second rotor and the third rotor are disposed at opposite sides of the first rotor.

15. The heat dissipating device as claimed in claim 1, wherein the heat dissipating device further comprises a first airflow guiding shroud disposed at one side of the outer frame.

16. The heat dissipating device as claimed in claim 15, wherein the heat dissipating device further comprises a second airflow guiding shroud disposed at the other side of the outer frame.

17. The heat dissipating device as claimed in claim 16 further comprising a plurality of static blades disposed in the second airflow guiding shroud.

18. The heat dissipating device as claimed in claim 16, wherein the first airflow guiding shroud or the second airflow guiding shroud comprises an outwardly-slanting or trumpet-like periphery, and is connected to the outer frame by engaging, locking or other equivalent ways.

19. The heat dissipating device as claimed in claim 1, wherein the first rotor or the second rotor further comprises a plurality of dissipating holes formed on a top surface thereof.

20. The heat dissipating device as claimed in claim 19, wherein each of the dissipating holes comprises a slanted side wall.

21. The heat dissipating device as claimed in claim 1, wherein the first hub of the first rotor comprises a cone, tapered or slanted surface.

22. The heat dissipating device as claimed in claim 1, wherein the first rotor blades of the first rotor and the second rotor blades of the second rotor have an upwardly slanted profile, respectively.

23. The heat dissipating device as claimed in claim 1, wherein the outer frame further comprises a plurality of extensions formed with holes.

* * * * *